United States Patent
Jung et al.

(10) Patent No.: US 7,802,358 B2
(45) Date of Patent: Sep. 28, 2010

(54) RIGID-FLEXIBLE PRINTED CIRCUIT BOARD MANUFACTURING METHOD FOR PACKAGE ON PACKAGE

(75) Inventors: Hoe-Ku Jung, Daejeon (KR); Myung-Sam Kang, Daejeon (KR); Jung-Hyun Park, Daejeon (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 0 days.

(21) Appl. No.: 12/453,832

(22) Filed: May 22, 2009

(65) Prior Publication Data

US 2009/0233400 A1  Sep. 17, 2009

Related U.S. Application Data

(62) Division of application No. 11/520,730, filed on Sep. 14, 2006.

(30) Foreign Application Priority Data

Sep. 14, 2005  (KR) .................. 10-2005-0085644

(51) Int. Cl.
*H05K 3/00* (2006.01)

(52) U.S. Cl. .................. 29/829; 438/107; 156/154; 257/E21.705

(58) Field of Classification Search .................. 29/829
See application file for complete search history.

(56) References Cited

U.S. PATENT DOCUMENTS

| 4,887,760 | A | | 12/1989 | Yoshino et al. |
| 5,622,588 | A | * | 4/1997 | Weber .................. 156/263 |
| 5,776,797 | A | | 7/1998 | Nicewarner, Jr. et al. |
| 2003/0020153 | A1 | * | 1/2003 | Bruce et al. .................. 257/686 |

FOREIGN PATENT DOCUMENTS

| JP | 5-95080 | 4/1993 |
| JP | 6-37408 | 2/1994 |
| JP | 6-216537 | 8/1994 |
| JP | 6-268339 | 9/1994 |

(Continued)

OTHER PUBLICATIONS

U.S. Appl. No. 11/520,730, filed Sep. 14, 2006, Hoe-Ku Jung et al., Samsung Electro-Mechanics Co., Ltd.
Korean Patent Office Notice of Preliminary Rejection, dated Sep. 18, 2006.

(Continued)

*Primary Examiner*—Derris H Banks
*Assistant Examiner*—Azm Parvez

(57) ABSTRACT

A manufacturing method for rigid-flexible multi-layer printed circuit board including: a flexible substrate of which circuits are formed on both sides and which is bendable; a rigid substrate which is laminated on the flexible substrate and circuits are formed on both sides and a cavity within which a semiconductor chip is mounted is formed; and a bonding sheet adhering the flexible substrate and the rigid substrate and having a insulating property. When the same numbers of the semiconductor chips are mounted or the POP is embodied, the whole thickness of the package can be lower. Also, two more semiconductor chips can be mounted using the space as the thickness of the core layer, and the structure impossible when the number of semiconductor chip mounted on the bottom substrate becomes two from one in conventional technology can be embodied.

11 Claims, 9 Drawing Sheets

FOREIGN PATENT DOCUMENTS

| | | |
|---|---|---|
| JP | 6-334098 | 12/1994 |
| JP | 2003-86761 | 3/2003 |
| JP | 2003-332743 | 11/2003 |
| JP | 2005-244257 | 9/2005 |

OTHER PUBLICATIONS

Japanese Office Action issued on Jan. 16, 2009 in corresponding Japanese Patent Application No. 2006-249968.
Office Action issued on Mar. 30, 2010 in corresponding U.S. Appl. No. 11/520,730.

\* cited by examiner

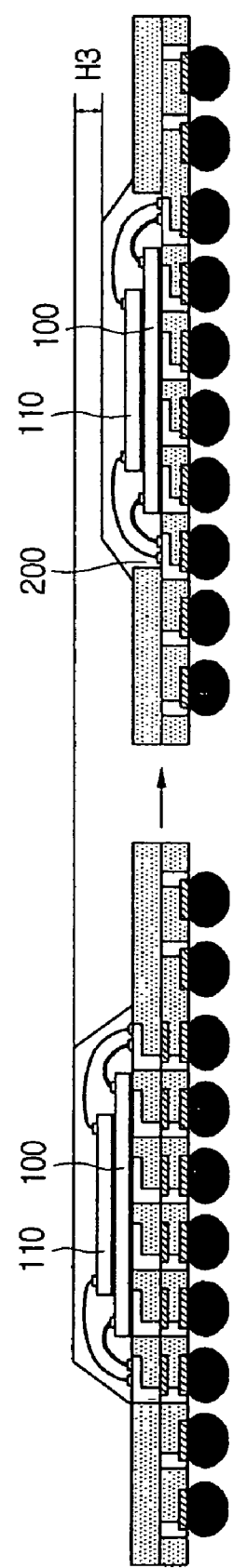

RIGID-FLEXIBLE PRINTED CIRCUIT BOARD MANUFACTURING METHOD FOR PACKAGE ON PACKAGE

CROSS-REFERENCE TO RELATED APPLICATIONS

This application is a U.S. divisional application filed under 35 USC 1.53(b) claiming priority benefit of U.S. Ser. No. 11/520,730 filed in the United States on Sep. 14, 2006, which claims earlier priority benefit to Korean Patent Application No. 10-2005-0085644 filed with the Korean Intellectual Property Office on Sep. 14, 2005, the disclosures of which are incorporated herein by reference.

BACKGROUND OF THE INVENTION

1. Field of the Invention

The present invention relates to a printed circuit board, in particular, to a printed circuit board for package on package and a manufacturing method thereof in which there is a level difference in the surface of the substrate for mounting 2 or more IC chips on the bottom substrate of the printed circuit board.

2. Description of the Related Art

Semiconductor packaging provides electrical connection to semiconductor chips including circuits and is seal-packaged to protect from any external impact so that it allows effect on the physical function and appearance for useful in the real life.

The semiconductor package is an outcome of the semiconductor packaging process to manufacture semiconductor chips as a product.

Even though from several tens to several hundreds of chips printed with identical circuits can be placed on one wafer, semiconductor chip itself cannot transfer or receive an electrical signal with electricity supplied from outside.

Moreover, the semiconductor chip can be damaged easily by an external impact because the semiconductor chip has fine circuits. That is, the semiconductor chip itself cannot be a perfect product, but it may play a role as a perfect product by mounting it on a printed circuit board.

A packaging technology affects reduction of the size of the semiconductor chip, improvement of ability to emit heat, electrical performance, reliability and depreciation. Therefore improvement of packaging technology is required to support high integration and high efficiency of semiconductor devices. The semiconductor package not only satisfies requirements of the semiconductor devices but also has packaging performance suitable for the condition when the chips are mounted on a printed circuit board.

Space to mount semiconductor chips currently has become smaller with high demand of miniaturized portable electronic devices and the number of semiconductor chips has currently been increased with high demand of multi-functions and high performance of products.

Because of the miniaturization, more capacity, and high processing speed of semiconductor chips, with rapid development of multimedia and computer communication industries, researches to find thinner semiconductor packages and higher integration with more pins have been increased.

Therefore, the semiconductor package must follow the trend of lightness, thinness and smallness in order to raise the efficiency of packaging per unit volume. According to the above trend, a chip size package (CSP), of which the size is almost same as the size of a chip, has introduced.

Beyond the package, which is minimized to the size of a chip, a stacked CSP (SCSP), which stacks one chip on another chip, or a multi chip module (MCM) package, which arranges several semiconductor chips having different functions in one package, has been also developed.

Package on package (POP), which stacks one package on another package, becomes popular for high density package. A thickness of a whole package is the most restriction for the embodiment of POP. There is a demand for mounting 2 or more semiconductor chips, instead of one semiconductor chip, on the bottom substrate, so that the performance of POP becomes higher.

FIGS. 1a and 1b show the figures of the structure of POP according to a conventional technology and a recent tendency.

Referring to FIG. 1a, conventionally one semiconductor chip 100 is stacked on a bottom substrate 10, and a thickness of a whole package is H1.

Referring to FIG. 1b, according to a recent tendency, two semiconductor chips 100 and 110 are stacked on a bottom substrate 10. In this case, a thickness of a whole package is H2. H2 is larger than H1 shown in FIG. 1a, which is against the tendency of lightness, thinness and smallness The thickness problem has been tried to solve by using a die thinning technology in order to lower the thickness of a whole package according to the tendency of lightness, thinness and smallness. But there are problems of function errors caused by operating semiconductor chips for a long period of time when thin semiconductor chips are used.

SUMMARY OF THE INVENTION

Accordingly, the present invention aims to provide a rigid-flexible printed circuit board having a cavity of a level difference in the surface of the substrate, on which semiconductor chips are mounted.

Also, the present invention aims to provide a rigid-flexible printed circuit board which can lower a thickness of whole packages when same numbers of the semiconductor chips are mounted.

Also, the present invention aims to provide a rigid-flexible printed circuit board in which the packaging of 2 or more semiconductor chips is possible using a space the same as a thickness of a core layer.

Also, the present invention aims to provide a rigid-flexible printed circuit board which can lower board warpage by using a thick core layer.

Also, the present invention aims to provide a rigid-flexible printed circuit board which can form a fine pattern using a flexible copper clad laminate (FCCL).

One aspect of the present invention provides a rigid-flexible multi-layer printed circuit board comprising: a flexible substrate of which circuits are formed on both sides and which is bendable; a rigid substrate having a cavity which is laminated on the flexible substrate and of which circuits are formed on both sides and semiconductor chips can be mounted in the cavity; and a bonding sheet adhering the flexible substrate and the rigid substrate and having a insulating property.

Here, the rigid substrate is thicker than the flexible substrate.

Also, wire bonding pads for electrical connection with the semiconductor chips are formed on the flexible substrate within the cavity and on the rigid substrate of the edge of opening part of the cavity.

Further, the flexible substrate and the rigid substrate are connected electrically therebetween through inner via holes or blind via holes.

Also, a plurality of the rigid substrates having the cavity are laminated with a predetermined gap on the flexible substrate and package on package (POP) is formed by folding the flexible substrate having the predetermined gap after semiconductor chips are mounted within the cavity.

Another aspect of the present invention provides a method for manufacturing a multi-layer rigid-flexible printed circuit board comprising: (a) forming a single circuit on a flexible substrate; (b) laminating a rigid substrate having a circuit and a cavity on the flexible substrate; (c) drilling via holes interconnecting the flexible substrate and the rigid substrate; (d) plating the via holes; (e) forming an outer circuit on a laminate of the flexible substrate and the rigid substrate; and (f) forming wire bonding pads for electrical connection with semiconductor chips on the flexible substrate within the cavity and on the rigid substrate of the edge of the opening part of the cavity.

Here, at the step (a), the single circuit is formed through a roll to roll process on the flexible substrate.

Also, the step (b) comprises: forming the cavity on the rigid substrate by using a punch or a router.

Further, the step (b) further comprises (b-1) laminating with pressure by using a bonding sheet between the flexible substrate and the rigid substrate. Here, the flexible substrate and the rigid substrate are laminated on a desired position using a rivet or a pin. Also, before the step (b-1), laminating a conformal film is further comprised so that the bonding sheet does not cover the wire bonding pads.

Also, in the step (b), a plurality of the rigid substrates are laminated on the flexible substrate with a predetermined gap, and after the step (f), (g) mounting a plurality of semiconductor chips within the each cavity, and (h) folding and molding the flexible substrate laminated with the predetermined gap are further comprised.

Additional aspects and advantages of the present general inventive concept will be set forth in part in the description which follows, and in part will be obvious from the description, or may be learned by practice of the general inventive concept.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which:

FIG. 2 shows a thinner package according to an embodiment of the present invention in comparison with the conventional invention;

FIG. 4b is a plan view of the rigid-flexible printed circuit board shown in FIG. 4a;

DETAILED DESCRIPTION OF THE PREFERRED EMBODIMENTS

Hereinafter, embodiments of the invention will be described in more detail with reference to the accompanying drawings. In the description with reference to the accompanying drawings, those components are rendered the same reference number that are the same or are in correspondence regardless of the figure number, and redundant explanations are omitted.

FIG. 2 shows a thinner package according to an embodiment of the present invention, in comparison with the conventional invention. A bottom substrate of a POP package is shown in FIG. 2.

Referring to FIG. 2, a package on the left side is a stack package on which 2 or more semiconductor chips 100 and 110 are mounted according to a conventional technology. A package on the right side has a cavity 200 according to an embodiment of the present invention and the semiconductor chips 100 and 110 are mounted therein so that a whole thickness of the POP package is reduced to H3. Therefore, the whole thickness of a POP package can be thinner by using a printed circuit board having a cavity formed to have a level difference in the surface of a substrate according to the present invention.

FIGS. 3a to 3j illustrate a method for forming a cavity to mount semiconductor chips on a rigid-flexible printed circuit board according to an embodiment of the present invention.

Figure 1A:
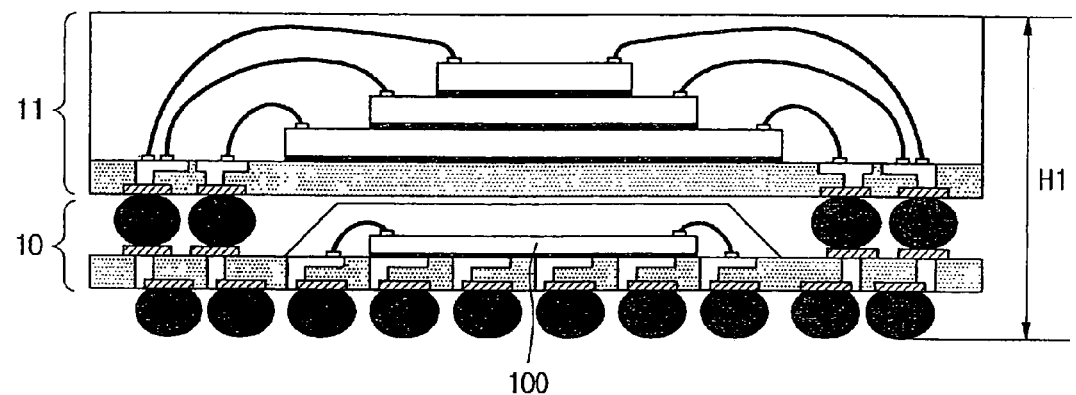
FIGS. 1a and 1b show the figures of the structure of POP according to the conventional technology and recent tendency.
Figure 1B:
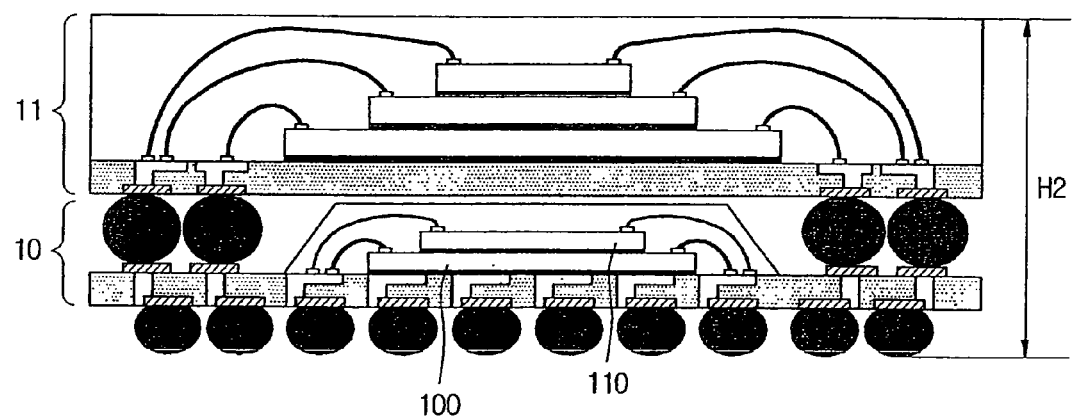
Figure 3A:
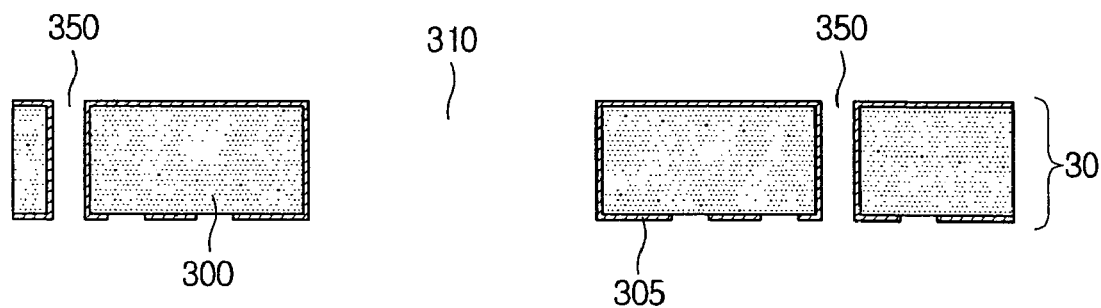
FIGS. 3a to 3j illustrate a method for forming a cavity to mount semiconductor chips on a rigid-flexible printed circuit board according to an embodiment of the present invention.

Referring to FIG. 3a, circuits and a cavity 310 are formed in a core layer 30.

First, an inner layer circuit 305 is formed on single side surface or double side surfaces of a resin layer of a copper clad laminate (CCL) 300 forming the core layer 30. In the present invention, the copper clad laminate 300 forming the core layer 30 is preferably a rigid substrate.

The inner layer circuit 305 is formed on the copper clad laminate or the substrate which copper plating is completed with a desired shape. The inner layer circuit 305 is formed by spreading a photosensitive photo resist on the substrate, adhering closely a photo mask on the substrate, forming a desired circuit on the photo resist using ultraviolet rays and etching unnecessary copper using a chemical reaction.

The inner layer circuit 305 can be formed by a subtractive process or additive process according to a manufacturing process.

The subtractive process is also termed as a 'tent and etch process' because etching is generally performed after tenting on parts where the circuit will be formed and the inner part of holes with the photo resist. The process involves exposing copper parts where circuits will be formed, etching the rest copper parts, and forming a circuit. Therefore, it is the process of removing copper used as a chemical. On the other hand, an additive process is a process forming a circuit by adding copper.

It is preferable that the inner layer circuit 305 be formed by the subtractive process and an outer layer circuit be formed by the additive process or a semi-additive process which is modification of the additive process. However, it is obvious that the inner layer circuit 305 or the outer layer circuit may be formed by various other processes.

Although the description below will focus on a case where the inner layer circuit 305 is formed by the subtractive process, this shall not limit the scope of the present invention.

In FIG. 3a, the copper clad laminate 300 forming the core layer is arranged. And holes 350 are formed as follows: drilling process using a mechanical drill, a punch, a router or a laser drill (namely, CO2 laser drill or Nd-Yag laser drill) and copper plating process through a chemical copper plating and an electrical copper plating. Through mask process and etching process, the inner layer circuit 305 is formed and an inspection of the inner layer circuit 305 is performed whether it is formed properly or not.

The holes 350 are preferably inner via holes (IVH). The inner via holes are blind and buried via holes, which interconnect between 2 or more conductive layers of a multi-layer printed circuit board but does not penetrate the multi-layer printed circuit board.

The cavity 310 for mounting semiconductor chips may be formed when the drilling process for forming the hole 350 is performed or separately through punching or mechanical drilling using a router or laser drilling using a CO2 laser drill or Nd-Yag laser drill after the inner layer circuit 305 is formed.

In the present invention, the core layer 30 is preferably thicker than a flexible substrate (FCCL) 330, by which unwanted parts of the FCCL 330 are prevented from bending. Namely, the warpage can be prevented.

Figure 3B:
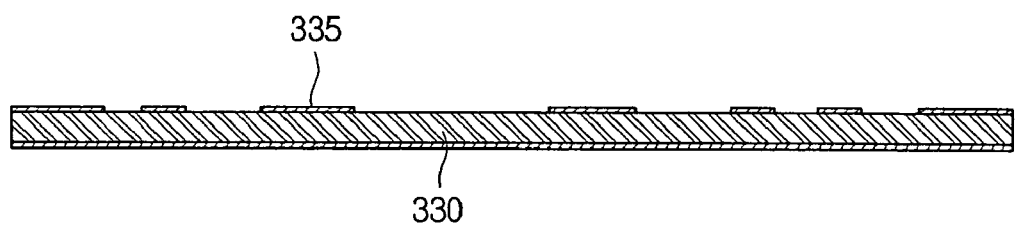

Referring to FIG. 3b, a FCCL 330 is prepared. And a single side surface circuit 335 is formed by a roll-to-roll process. A via land where a via will be formed and a circuit pattern are formed.

Herein, the roll-to-roll process is a process using rolls in order to support the FCCL 330 flatly and form a single side surface circuit 335 because the FCCL 330 is thin and bendable.

A feeder part and a winder part have each roll. The FCCL 330 is maintained the flat while it is rolled from the feeder part to the winder part. While the FCCL 330 is moving from the feeder part to the winder part, the single side surface circuit 335 is formed through a general process such as dry film lamination, exposure, developing, drilling, routing, and plating, etc.

Figure 3C:
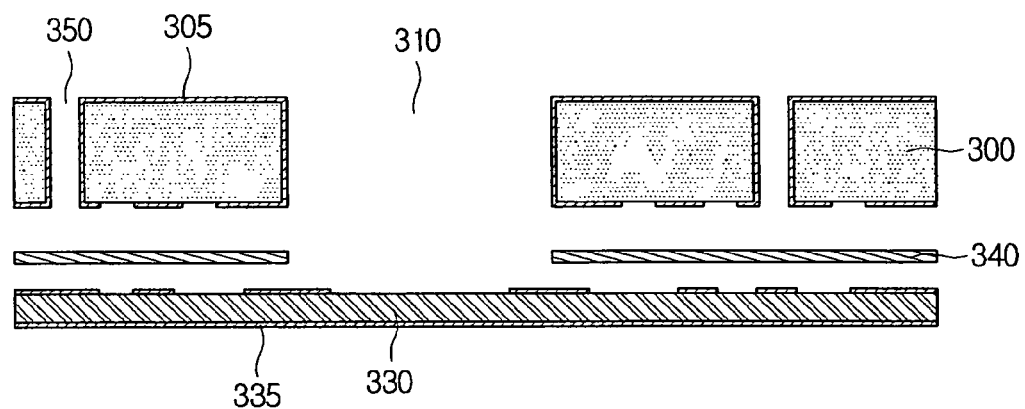

Referring to FIG. 3c, the core layer 30 and the FCCL 330, in which each circuit is formed, are laminated using a bonding sheet 340. During the above laminating, a laminating using rivet or pin is performed in order to provide accurate align of the core layer 30 and the FCCL 330. The bonding sheet 340 is a sheet made of an adhesive material in order to glue each layer, and it may be a prepreg or a bonding film.

Figure 3D:
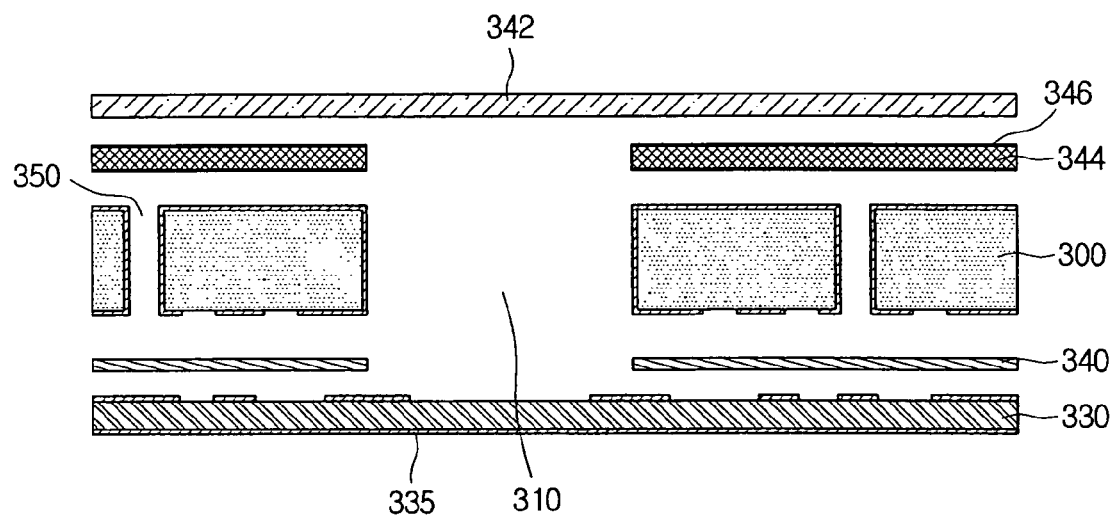
Figure 3E:
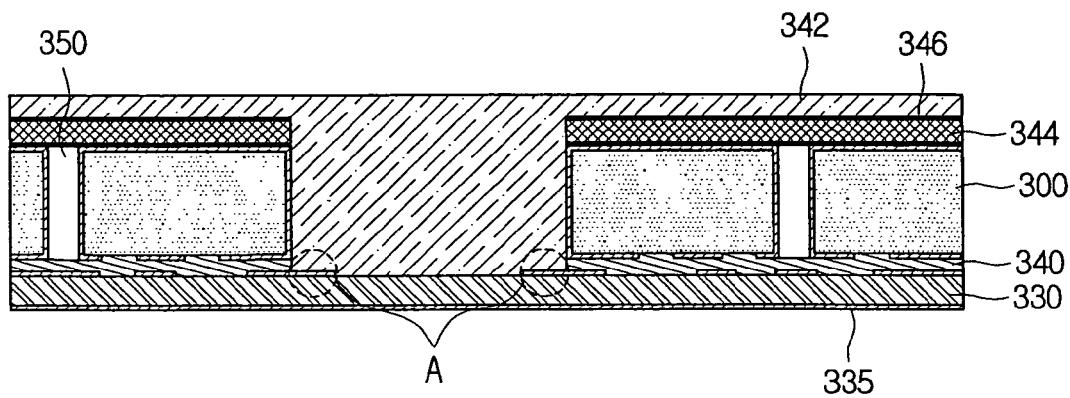

A pad part (A in FIG. 3e) is not covered by the bonding sheet 340 when the core layer 30 and the FCCL 330 are laminated by using the bonding sheet 340, as shown in FIGS. 3d and 3e.

Referring to FIGS. 3d and 3e, a conformal film 342 is used so that the bonding sheet 340 does not cover the pad part (A in FIG. 3e) where the circuit formed in the inner layer is connected when semiconductor chips are mounted. Also, the conformal film 342 provides uniform pressure to the substrate by filling the cavity 310 with its melted one while the laminating process. The bonding sheet 340 thus allows that the core layer 30 adheres to the FCCL 330 with the even pressure. Polyethylene film or polyvinyl chloride film can be used as the conformal film 342.

At this time, a dummy board 344 is used as buffer to protect not to concentrate the pressure to the edge of the opening part of the cavity 310 and prevents damage of the circuit. And a release film 346 is used in order to remove easily the dummy film 344 from the substrate later.

Figure 3F:
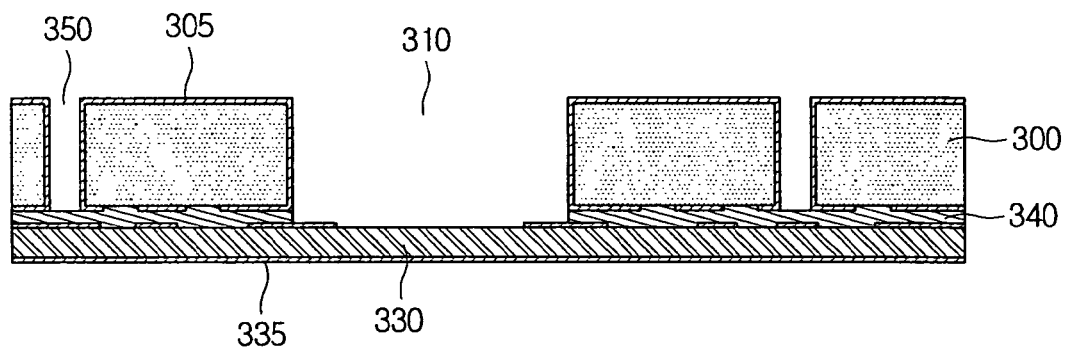

The conformal film 342, the dummy film 344 and the release film 346 are removed, and a multi-layer printed circuit board, on which the FCCL 330 and the core layer 30, in which the cavity 310 is formed, are laminated, is formed as shown in FIG. 3f.

Figure 3G:
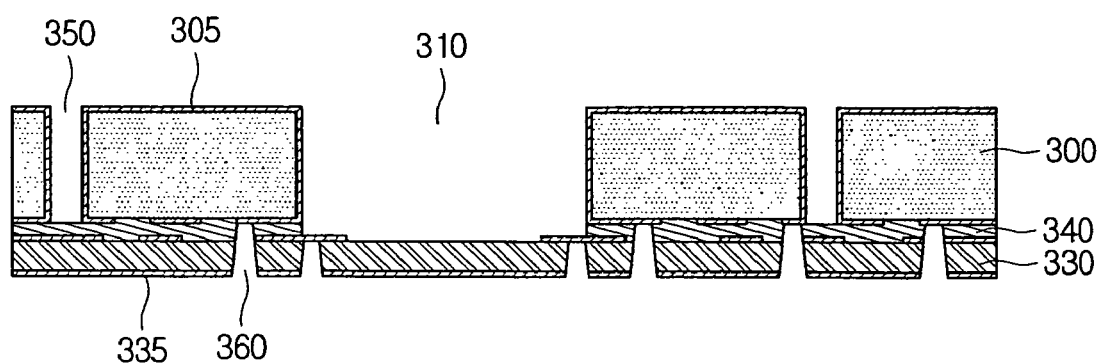

Referring to FIG. 3g, vias 360 are formed in the insulation parts of the FCCL 330 by using a laser drill (namely, a CO2 laser drill or Nd-Yag laser drill) on the laminate shown in FIG. 3f. The vias 360 provide electrical connection between the circuits 335 formed on the surface of the FCCL 330 and interconnect between the FCCL 330 and the core layer 30. Size of the via and drilling condition may be determined according to a thickness of the FCCL 330 and a thickness of the bonding sheet 340. The via 360 is preferably blind via hole.

Figure 3H:
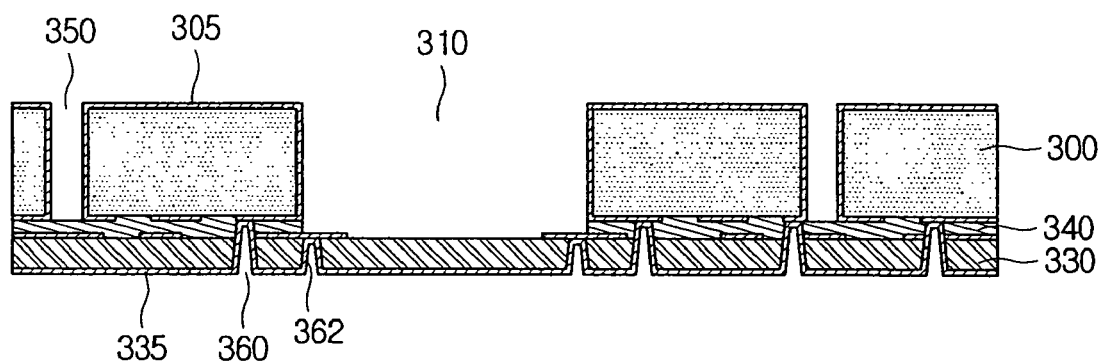

Referring to FIG. 3h, the core layer 30 and the FCCL 330 are connected by forming a seed layer after a surface treatment (IAR: ion assisted reaction) of the part where the via 360 is formed, and plating 362. The seed layer may be formed by chemical plating or sputtering, and after plating, the via part is plated through electrolytic plating. For example, the seed layer is copper-plating having a thickness of 0.3 to 1.5 µm, and the seed layer is further plated to provide a thickness of about 10 µm through the electrolytic plating.

In the above plating process, the part except the via 360 is covered with a protection film in order to protect the pad part of the core layer 30 and the FCCL 330 (A in FIG. 3e).

Figure 3I:
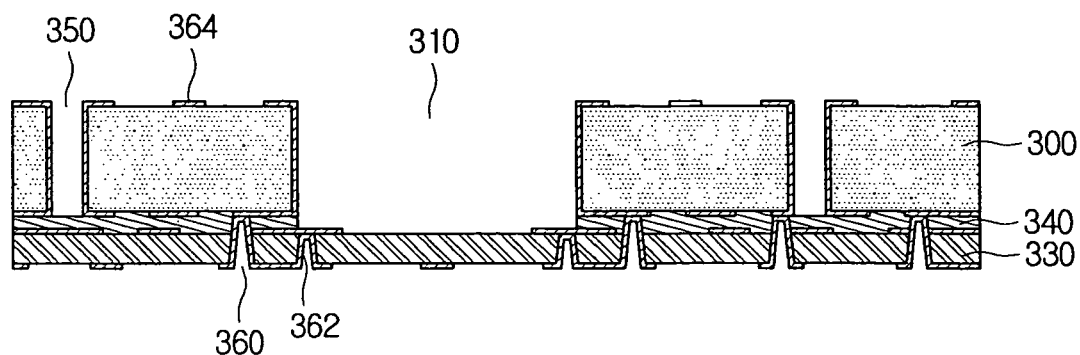

Referring to FIG. 3i, an outer circuit 364 is formed on both sides of the laminate in which the via 360 is formed and which is plated. The outer circuit 364 is formed by laminating a dry film, etching the copper of unnecessary parts, except the part being a via or a circuit through the tenting method and forming the circuit. This is possible by the above process described referring to FIG. 3a.

Figure 3J:
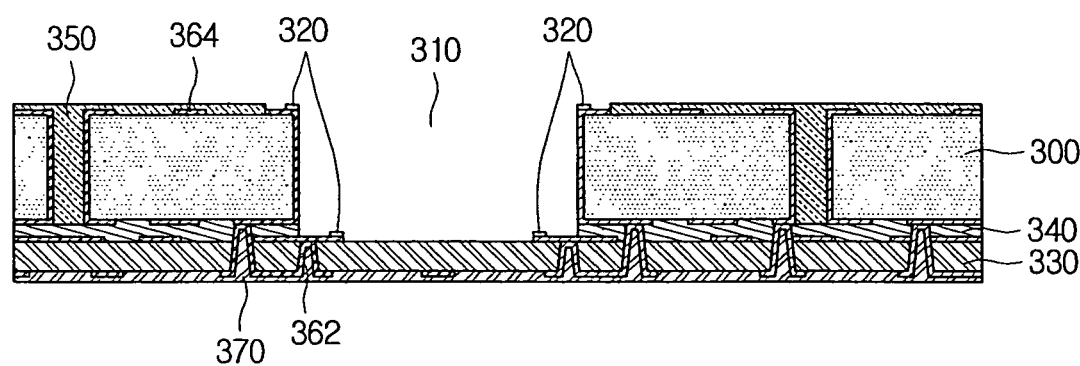

Referring to FIG. 3j, photo solder resist (PSR) printing is performed for the protection of the outer circuit 364. The outer circuit is protected by coating with the solder resist 370. PSR ink, as the solder resist 370, is used in order that solder, which is used so as to mount components on the printed circuit board, is adhered on necessary parts and is thus prevented from being adhered on unnecessary parts. Because of properties of the PSR ink, the PSR ink helps the solder not to adhere on parts where the PSR ink is remained and to adhere on parts where the PSR ink is not remained so that electronic components can be mounted on the parts where the solder is adhered. Also, the PSR ink is coated in order to protect the surface circuit of the printed circuit board from an outer environment.

The solder mask printing process comprises forming roughness on the outer circuit 364 in order that the PSR ink can adhere well with the printed circuit board, removing pollutants, coating with the PSR ink by using a screen printing method or a spray coating method, exposing, developing and complete hardening.

Also, in the case of mounting semiconductor chip within the cavity 310, a wire bonding pad 320 is formed through the electrolytic gold-plating or the electroless gold-plating in order to connect electrically between the core layer 30 and the FCCL 330. Through the gold-plating, electrical connection and protection from the outer environment are possible.

The electrolytic gold-plating is a plating method by extracting gold electrically, and is divided to soft gold and hard gold according to the hardness of gold. Soft gold is applied to products which bonding properties are needed, such as ball grid array and the like, and hard gold is applied to products needing high abrasion resistance and electrical properties. The electroless gold-plating is a plating method by using a chemical reaction not through electric, and is divided to flash plating and thickness plating according to a thickness of the gold-plating.

In the present invention, the wire bonding pad 320 has preferably two layers each formed on the core layer 30 and the FCCL 330 in order to mount two or more semiconductor chips.

Also, at the time forming POP, a bump forming pad (not shown), on which the bump can be formed for connecting electrically with another printed circuit board package laminated on the printed circuit board package in FIG. 3j and maintaining a lamination gap, is formed on the core layer 30. The bump forming pad may also be formed through the electrolytic or electroless gold-plating. Electrical connection and protection from the outer environment is possible by the gold-plating.

Figure 4A:
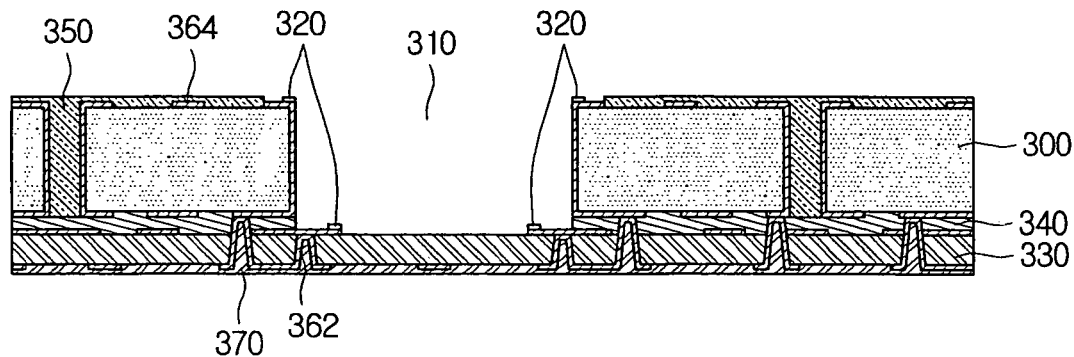
FIG. 4a is a cross sectional view of the rigid-flexible printed circuit board manufactured by the processes shown in FIGS. 3a to 3j.

FIG. 4a is a cross section of the rigid-flexible printed circuit board manufactured by the processes shown in FIGS. 3a to 3j, and FIG. 4b is a plan view of the rigid-flexible printed circuit board shown in FIG. 4a.

Referring to FIG. 4a, the rigid-flexible printed circuit board comprises a core layer 30, an FCCL 330, a bonding sheet 340, a cavity 310 within the core layer 30, a wire bonding pad 320 and vias 350.

Figure 4B:
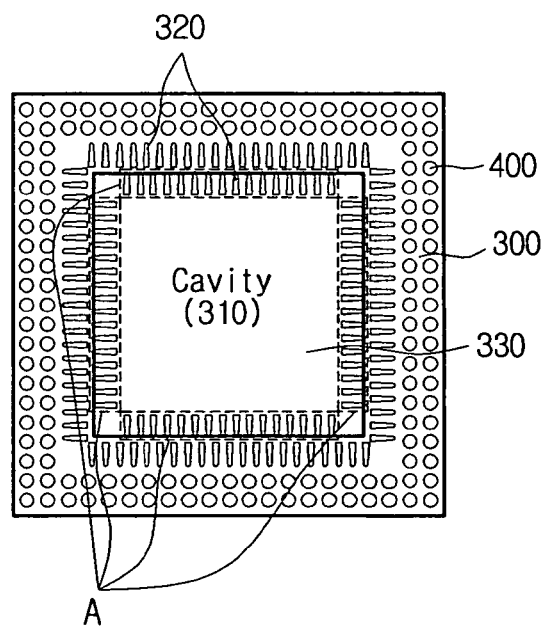

Referring to FIG. 4b, the core layer 30 is laminated on the FCCL 330, and the cavity 310, within which a semiconductor chip can be mounted, is formed in the core layer 30. The wire bonding pad 320 for electrical connection with the semiconductor chip is formed on the A part of the FCCL 330 exposed through the cavity 310. And another wire bonding pad 320 for electrical connection with the semiconductor chip is formed on the edge of the opening part of the cavity 310 of the core layer 30.

And a bump forming pad, namely a ball pad 400, on which the bump can be formed for connecting electrically with another printed circuit board package on the printed circuit board package in FIG. 3j and maintaining the lamination gap, is formed on the core layer 30.

Figure 5A:
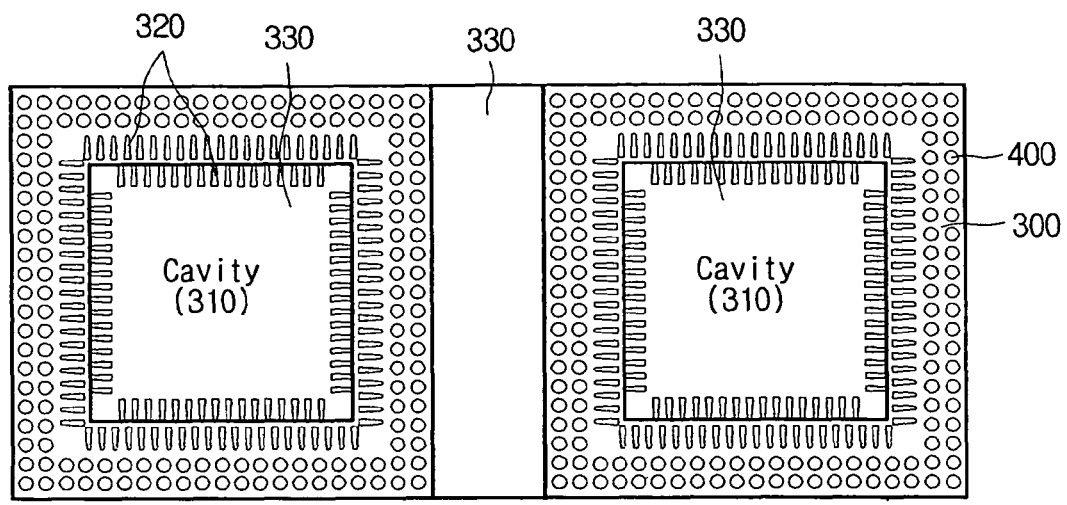
FIG. 5a shows the unfolded rigid-flexible printed circuit board for POP according to an embodiment of the present invention.
Figure 5B:
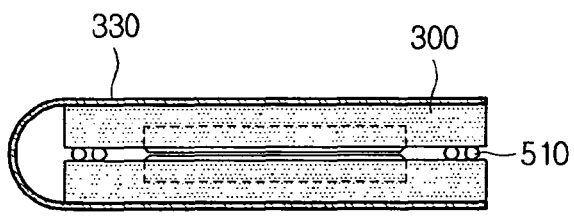
FIG. 5b is an exemplary view illustrating the smaller rigid-flexible printed circuit board for POP shown in FIG. 5a by folding itself.

FIG. 5a shows the unfolded rigid-flexible printed circuit board for POP according to an embodiment of the present invention and FIG. 5b is an exemplary view illustrating the smaller rigid-flexible printed circuit board for POP shown in FIG. 5a by folding itself.

Referring to FIG. 5a, two core layers 30 having the cavity 310 shown in FIG. 4b are laminated on the FCCL 330 with a predetermined gap.

And then, each core layer 30 is laminated each other by folding the center part of the FCCL 330 where the core layer 30 is not laminated as shown in FIG. 5b. At this time, the electrical connection and the gap between the packages can be maintained by forming the bump 510 on the ball pad 400.

The miniaturized rigid-flexible printed circuit board for POP may be stably mounted in products by maintaining the folded shape through molding.

As described above, the rigid-flexible printed circuit board of the present invention is manufactured to have a level difference in the surface of a substrate by forming a cavity in the part on which semiconductor chips are mounted.

Also, when the same numbers of semiconductor chips are mounted, a thickness of the whole package can be reduced or when POP is embodied, a whole thickness of the package can be lower.

Also, two or more semiconductor chips can be mounted using the same space as a thickness of the core layer, and when the number of semiconductor chip to be mounted on the bottom of the substrate is increased from 1 to 2, it becomes possible which was impossible with the conventional flexible printed circuit.

Also, board warpage may be reduced by using a thick core layer.

Also, a fine pattern may be formed by using a flexible substrate.

While the above description has pointed out novel features of the invention as applied to various embodiments, the skilled person will understand that various omissions, substitutions, and changes in the form and details of the device or process illustrated may be made without departing from the scope of the invention. Therefore, the scope of the invention is defined by the appended claims rather than by the foregoing description. All variations coming within the meaning and range of equivalency of the claims are embraced within their scope.

What is claimed is:

1. A method for manufacturing a multi-layer rigid-flexible printed circuit board comprising:
    forming a single circuit on a flexible substrate;
    laminating a pair of rigid substrates having a circuit and a cavity respectively on the flexible substrate with a predetermined gap;
    drilling via holes interconnecting the flexible substrate and the pair of rigid substrates;
    plating the via holes;
    forming an outer circuit on a laminate of the flexible substrate and the pair of rigid substrates; and
    forming wire bonding pads for electrical connection with semiconductor chips on the flexible substrate within the cavity and on the rigid substrate of the edge of the opening part of the cavity
    wherein at the forming a single circuit, the single circuit is formed through a roll to roll process on the flexible substrate.

2. The method for manufacturing a multi-layer rigid-flexible printed circuit board of claim 1, wherein the laminating a pair of rigid substrates comprises: forming the cavity on the pair of rigid substrates by using a punch or a router.

3. The method for manufacturing a multi-layer rigid-flexible printed circuit board of claim 1, wherein the laminating a pair of rigid substrates further comprises laminating with pressure by using a bonding sheet between the flexible substrate and the pair of rigid substrates.

4. A method for manufacturing a multi-layer rigid-flexible printed circuit board comprising:
    forming a single circuit on a flexible substrate;
    laminating a pair of rigid substrate having a circuit and a cavity respectively on the flexible substrate with a predetermined gap;
    drilling via holes interconnecting the flexible substrate and the rigid substrate;
    plating the via holes;
    forming an outer circuit on a laminate of the flexible substrate and the rigid substrate; and
    forming wire bonding pads for electrical connection with semiconductor chips on the flexible substrate within the cavity and on the rigid substrate of the edge of the opening part of the cavity wherein the flexible substrate and the rigid substrate are laminated on a desired position using a rivet or a pin.

5. The method for manufacturing a multi-layer rigid-flexible printed circuit board of claim 3, wherein before the laminating with pressure, laminating a conformal film is further comprised so that the bonding sheet does not cover the wire bonding pads.

6. A method for manufacturing a multi-layer rigid-flexible printed circuit board comprising:
 forming a single circuit on a flexible substrate;
 laminating a pair of rigid substrates having a circuit and a cavity respectively on the flexible substrate with a predetermined gap;
 mounting a semiconductor chips in each of the cavities,
 folding the flexible substrate in such a way that the pair of rigid substrates are stacked to face each other, and the pair of rigid substrates form a package-on-package (POP) by being directly connected to each other through a bump; and
 molding the folded flexible substrate.

7. The method for manufacturing a multi-layer rigid-flexible printed circuit board of claim 6, wherein at the forming a single circuit, the single circuit is formed through a roll process on the flexible substrate.

8. The method for manufacturing a multi-layer rigid-flexible printed circuit board of claim 6, wherein the laminating a pair of rigid substrates comprises: forming the cavity on the rigid substrate by using a punch or a router.

9. The method for manufacturing a multi-layer rigid-flexible printed circuit board of claim 6, wherein the laminating a pair of rigid substrates further comprises laminating with pressure by using a bonding sheet between the flexible substrate and the pair of rigid substrates.

10. The method for manufacturing a multi-layer rigid-flexible printed circuit board of claim 8, wherein the flexible substrate and the pair of rigid substrates are laminated on a desired position using a rivet or a pin.

11. The method for manufacturing a multi-layer rigid-flexible printed circuit board of claim 9, wherein before the laminating with pressure, laminating a conformal film is further comprised so that the bonding sheet does not cover the wire bonding pads.

* * * * *

UNITED STATES PATENT AND TRADEMARK OFFICE
CERTIFICATE OF CORRECTION

PATENT NO. : 7,802,358 B2
APPLICATION NO. : 12/453832
DATED : September 28, 2010
INVENTOR(S) : Hoe-Ku Jung et al.

It is certified that error appears in the above-identified patent and that said Letters Patent is hereby corrected as shown below:

Column 8, Line 33 delete "cavity" and insert --cavity,--.

Column 9, Line 7 delete "chips" and insert --chip--.

Signed and Sealed this

Fourteenth Day of December, 2010

David J. Kappos
*Director of the United States Patent and Trademark Office*